(12) United States Patent
Welch et al.

(10) Patent No.: US 9,431,590 B2
(45) Date of Patent: Aug. 30, 2016

(54) CERAMIC BASED LIGHT EMITTING DIODE (LED) DEVICES AND METHODS

(71) Applicant: Cree, Inc., Durham, NC (US)

(72) Inventors: Erin R. F. Welch, Chapel Hill, NC (US); Harry A. Seibel, II, Durham, NC (US); Christopher P. Hussell, Cary, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 14/216,146

(22) Filed: Mar. 17, 2014

(65) Prior Publication Data

US 2014/0264397 A1    Sep. 18, 2014

Related U.S. Application Data

(60) Provisional application No. 61/788,075, filed on Mar. 15, 2013.

(51) Int. Cl.
| | |
|---|---|
| *H01L 29/22* | (2006.01) |
| *H01L 33/58* | (2010.01) |
| *H01L 33/48* | (2010.01) |
| *H01L 27/15* | (2006.01) |
| *F21K 99/00* | (2016.01) |
| *H01L 33/56* | (2010.01) |
| *F21Y 101/02* | (2006.01) |
| *F21Y 105/00* | (2016.01) |
| *F21Y 111/00* | (2016.01) |

(52) U.S. Cl.
CPC .......... *H01L 33/58* (2013.01); *F21K 9/00* (2013.01); *F21K 9/13* (2013.01); *H01L 27/153* (2013.01); *H01L 33/486* (2013.01); *H01L 33/56* (2013.01); *F21Y 2101/02* (2013.01); *F21Y 2105/005* (2013.01); *F21Y 2111/002* (2013.01); *F21Y 2111/005* (2013.01); *Y10T 29/41* (2015.01)

(58) Field of Classification Search
CPC ..... H01L 33/56; H01L 33/58; H01L 33/486; H01L 27/153
USPC .................................................... 257/98–100
See application file for complete search history.

(56) References Cited

U.S. PATENT DOCUMENTS

| | | | |
|---|---|---|---|
| 4,946,547 A | 8/1990 | Palmour et al. | |
| 5,200,022 A | 4/1993 | Kong et al. | |
| RE34,861 E | 2/1995 | Davis et al. | |
| 7,791,061 B2 | 9/2010 | Edmond et al. | |
| 2006/0214274 A1* | 9/2006 | Shimokawa | H01L 24/29 257/678 |
| 2008/0025130 A1 | 1/2008 | Bartley et al. | |
| 2008/0224161 A1* | 9/2008 | Takada | 257/98 |
| 2010/0193822 A1* | 8/2010 | Inobe et al. | 257/98 |
| 2011/0220926 A1* | 9/2011 | Kim | 257/91 |

(Continued)

*Primary Examiner* — Matthew E Warren
(74) *Attorney, Agent, or Firm* — Jenkins, Wilson, Taylor & Hunt, P.A.

(57) ABSTRACT

Light emitter devices, such as light emitting diode (LED) devices and related methods are disclosed. A light emitter device includes a ceramic based substrate, at least one LED chip disposed on the substrate, and a filling material. The ceramic substrate can include one or more surface features. The filling material can be disposed over and/or within a portion of the one or more surface features. Surface features can include one or more pedestals, trenches, holes, indentions, depressions, waves, and/or convexly or concavely curved surfaces. Surface features can improve optics of the LED device, for example, improving brightness, reflection, and/or light extraction associated with the device. Related methods are disclosed.

23 Claims, 9 Drawing Sheets

(56) References Cited

U.S. PATENT DOCUMENTS

| | | | |
|---|---|---|---|
| 2011/0249424 A1* | 10/2011 | Joo et al. | 362/97.1 |
| 2012/0193649 A1 | 8/2012 | Donofrio et al. | |
| 2012/0193662 A1 | 8/2012 | Donofrio et al. | |
| 2014/0048834 A1* | 2/2014 | Sato et al. | 257/98 |

* cited by examiner

CERAMIC BASED LIGHT EMITTING DIODE (LED) DEVICES AND METHODS

CROSS REFERENCE TO RELATED APPLICATION

This application relates to and claims priority to U.S. Provisional Patent Application Ser. No. 61/788,075, filed Mar. 15, 2013, the disclosure of which is incorporated by reference herein in the entirety.

TECHNICAL FIELD

The subject matter disclosed herein relates generally to light emitting diode (LED) devices and methods. More particularly, the subject matter disclosed herein relates to ceramic based LED devices and methods.

BACKGROUND

Light emitting diodes (LEDs) or LED chips are solid state emitters that convert electrical energy into light. LED chips can be utilized in light emitter devices (e.g., packages or components) and systems for providing different colors and patterns of light useful in various lighting and optoelectronic applications. For example, light emitter devices can be used in various LED light bulb and light fixture applications and are developing as replacements for incandescent, fluorescent, and metal halide high-intensity discharge (HID) lighting applications.

Manufacturers of LED lighting products are constantly seeking ways to reduce their cost in order to provide a lower initial cost to customers, and encourage the adoption of LED products. Brighter, more efficient LED chips and/or devices can allow lighting manufacturers to use fewer LED chips to get the same brightness at a lower cost or increase brightness levels using the same LED chip count and power. Such improvements can enable delivery of improved LED devices for less total cost than other solutions. Conventional research efforts aimed at increasing lumen output and optical efficiency from LED chips are focused on device structures and/or materials, which can lead to devices that are more expensive and time-consuming to fabricate.

Accordingly, and despite the availability of various LED devices and components in the marketplace, a need remains for brighter and more efficient devices and methods that can be produced quickly and at a lower cost. Such devices can also make it easier for end-users to justify switching to LED products from a return on investment or payback perspective.

SUMMARY

Light emitter devices, such as light emitting diode (LED) devices and related methods are disclosed. A light emitter device can comprise a ceramic based substrate, at least one LED chip disposed on the substrate, and a filling material. The ceramic substrate can comprise one or more surface features. The filling material can be disposed over and/or within a portion of the one or more surface features. Surface features can comprise one or more pedestals, trenches, holes, indentions, depressions, waves, and/or convexly or concavely curved surfaces. Surface features can improve optics of the LED device, for example, improving brightness, reflection, and/or light extraction associated with the device.

A method of providing a light emitter device comprises providing a ceramic substrate, texturizing a surface of the ceramic based substrate for improved optics, and attaching at least one light emitting diode (LED) chip to the texturized substrate. Texturizing the surface can improve optics of the LED device, for example, improving brightness, reflection, and/or light extraction associated with the device. Allowing heat to dissipate directly from LED chips into the ceramic substrate can improve thermal properties of the device.

The surfaces of ceramic based substrates as described herein can also be treated with one or more dopants and/or doped sheets of material for improving optics and/or heat dissipation properties of the substrate.

Other aspects, features and embodiments of the subject matter will be more fully apparent from the ensuing disclosure and appended claims. Devices and methods provided herein can include improved thermal management capabilities and improved brightness. These and other objects can be achieved according to the subject matter herein.

BRIEF DESCRIPTION OF THE DRAWINGS

A full and enabling disclosure of the present subject matter is set forth more particularly in the remainder of the specification, including reference to the accompanying figures, relating to one or more embodiments, in which:

FIGS. 4A to 5F are schematic illustrations of LED devices having surface treatments provided in accordance with aspects of the subject matter described herein.

DETAILED DESCRIPTION

The subject matter disclosed herein is directed to ceramic based light emitting diode (LED) devices and related methods for use with LED chips. In some aspects, LED devices and related methods can be substrate based devices having chip on board (COB) LED chips provided thereon. The substrates can be treated or processed as described herein, for providing a surface topography and/or surface structure to improve light extraction, color rendering, and/or reflection from devices described herein. LED devices and methods provided herein can also exhibit improved manufacturability as well increased light emission at a lower cost.

Light emitter devices, such as light emitting diode (LED) devices and related methods are disclosed. A light emitter device can comprise a ceramic based substrate, at least one LED chip disposed on the substrate, and a filling material. The ceramic substrate can comprise one or more surface features. The filling material can be disposed over and/or within a portion of the one or more surface features. Surface features can comprise one or more pedestals, trenches, holes, indentions, depressions, waves, and/or convexly or concavely curved surfaces. Surface features can improve optics of the LED device, for example, improving brightness, reflection, and/or light extraction associated with the device.

In one aspect, a method of providing a light emitter device comprises providing a ceramic substrate, texturizing a surface of the ceramic based substrate for improved optics, and attaching at least one light emitting diode (LED) chip to the texturized substrate. Texturizing the surface can improve optics of the LED device, for example, improving brightness, reflection, and/or light extraction associated with the device. Allowing heat to dissipate directly from LED chips into the ceramic substrate can improve thermal properties of the device.

The surfaces of ceramic based substrates as described herein can also be treated with one or more dopants and/or doped sheets of material for improving optics and/or heat dissipation properties of the substrate.

Reference will be made in detail to possible aspects or embodiments of the subject matter herein, one or more examples of which are shown in the figures. Each example is provided to explain the subject matter and not as a limitation. In fact, features illustrated or described as part of one embodiment can be used in another embodiment to yield still a further embodiment. It is intended that the subject matter disclosed and envisioned herein covers such modifications and variations.

As illustrated in the various figures, some sizes of structures or portions are exaggerated relative to other structures or portions for illustrative purposes and, thus, are provided to illustrate the general structures of the present subject matter. Furthermore, various aspects of the present subject matter are described with reference to a structure or a portion being formed on other structures, portions, or both. As will be appreciated by those of skill in the art, references to a structure being formed "on" or "above" another structure or portion contemplates that additional structure, portion, or both may intervene. References to a structure or a portion being formed "on" another structure or portion without an intervening structure or portion are described herein as being formed "directly on" the structure or portion. Similarly, it will be understood that when an element is referred to as being "connected", "attached", or "coupled" to another element, it can be directly connected, attached, or coupled to the other element, or intervening elements may be present. In contrast, when an element is referred to as being "directly connected", "directly attached", or "directly coupled" to another element, no intervening elements are present.

Furthermore, relative terms such as "on", "above", "upper", "top", "lower", or "bottom" are used herein to describe one structure's or portion's relationship to another structure or portion as illustrated in the figures. It will be understood that relative terms such as "on", "above", "upper", "top", "lower" or "bottom" are intended to encompass different orientations of the device in addition to the orientation depicted in the figures. For example, if the device in the figures is turned over, structure or portion described as "above" other structures or portions would now be oriented "below" the other structures or portions. Likewise, if devices or components in the figures are rotated along an axis, structure or portion described as "above", other structures or portions would be oriented "next to" or "left of" the other structures or portions. Like numbers refer to like elements throughout.

Unless the absence of one or more elements is specifically recited, the terms "comprising", including", and "having" as used herein should be interpreted as open-ended terms that do not preclude the presence of one or more elements.

As used herein a "ceramic based material" or the term "ceramic based" includes a material that consists primarily of a ceramic material, such as an inorganic, non-metallic material made from compounds of a metal or metalloid and a non-metal (e.g., aluminum nitride, aluminum oxide, beryllium oxide, silicon carbide). A "non-ceramic based material" consists primarily a metallic material, a primarily organic (e.g., polymeric) material, and/or a primarily synthetic or semi-synthetic organic solid that can be dispensed or molded (e.g., plastic).

Light emitter devices according to embodiments described herein can comprise group III-V nitride (e.g., gallium nitride (GaN)) based LED chips or lasers. Fabrication of LED chips and lasers is generally known and only briefly described herein. LED chips or lasers can be fabricated on a growth substrate, for example, a silicon carbide (SiC) substrate, such as those devices manufactured and sold by Cree, Inc. of Durham, N.C. Other growth substrates are also contemplated herein, for example and not limited to sapphire, silicon (Si), and GaN. In one aspect, SiC substrates/layers can be 4H polytype silicon carbide substrates/layers. Other SiC candidate polytypes, such as 3C, 6H, and 15R polytypes, however, can be used. Appropriate SiC substrates are available from Cree, Inc., of Durham, N.C., the assignee of the present subject matter, and the methods for producing such substrates are set forth in the scientific literature as well as in a number of commonly assigned U.S. patents, including but not limited to U.S. Pat. No. Re. 34,861; U.S. Pat. Nos. 4,946,547; and 5,200,022, the disclosures of which are incorporated by reference herein in their entireties. Any other suitable growth substrates are contemplated herein.

As used herein, the term "Group III nitride" refers to those semiconducting compounds formed between nitrogen and one or more elements in Group III of the periodic table, usually aluminum (Al), gallium (Ga), and indium (In). The term also refers to binary, ternary, and quaternary compounds such as GaN, AlGaN and AlInGaN. The Group III elements can combine with nitrogen to form binary (e.g., GaN), ternary (e.g., AlGaN), and quaternary (e.g., AlInGaN) compounds. These compounds may have empirical formulas in which one mole of nitrogen is combined with a total of one mole of the Group III elements. Accordingly, formulas such as $Al_xGa_{1-x}N$ where $1>x>0$ are often used to describe these compounds. Techniques for epitaxial growth of Group III nitrides have become reasonably well developed and reported in the appropriate scientific literature.

Although various embodiments of LED chips disclosed herein can comprise a growth substrate, it will be understood by those skilled in the art that the crystalline epitaxial growth substrate on which the epitaxial layers comprising an LED chip are grown can be removed, and the freestanding epitaxial layers can be mounted on a substitute carrier substrate or substrate which can have different thermal, electrical, structural and/or optical characteristics than the original substrate. The subject matter described herein is not limited to structures having crystalline epitaxial growth substrates and can be used in connection with structures in which the epitaxial layers have been removed from their original growth substrates and bonded to substitute carrier substrates.

Group III nitride based LED chips according to some embodiments of the present subject matter, for example, can be fabricated on growth substrates (e.g., Si, SiC, or sapphire substrates) to provide horizontal devices (with at least two electrical contacts on a same side of the LED chip) or vertical devices (with electrical contacts on opposing sides of the LED chip). Moreover, the growth substrate can be maintained on the LED chip after fabrication or removed (e.g., by etching, grinding, polishing, etc.). The growth substrate can be removed, for example, to reduce a thickness of the resulting LED chip and/or to reduce a forward voltage through a vertical LED chip. A horizontal device (with or without the growth substrate), for example, can be flip chip bonded (e.g., using solder) to a carrier substrate or printed circuit board (PCB), or wirebonded. A vertical device (with or without the growth substrate) can have a first terminal (e.g., anode or cathode) solder bonded to a carrier substrate, mounting pad, or PCB and a second terminal (e.g., the opposing anode or cathode) wirebonded to the carrier substrate, electrical element, or PCB. Examples of vertical and horizontal LED chip structures are discussed by way of example in U.S. Publication No. 2008/0258130 to Bergmann et al. and in U.S. Pat. No. 7,791,061 to Edmond et al. which issued on Sep. 7, 2010, the disclosures of which are hereby incorporated by reference herein in their entireties.

As used herein, "direct attach" as used to describe an LED chip or chips includes, without limitation, an LED chip and attachment method as described for example in U.S. Publication Nos. 2012/0193649 and 2012/0193662, both filed on Aug. 2, 2012 and commonly owned herewith, the contents of both of which are incorporated by reference in their entireties herein.

Figure 1A:
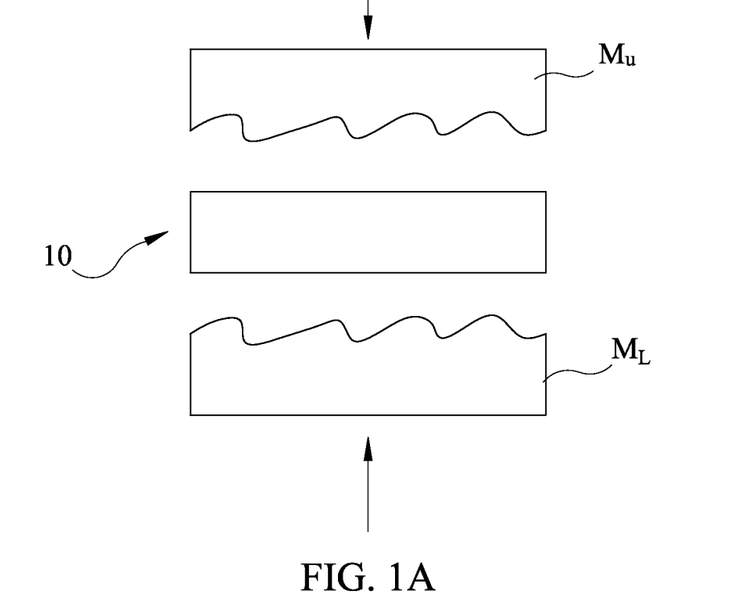
FIGS. 1A and 1B are schematic illustrations of providing substrates for light emitting diode (LED) devices with surface shaping and/or surface topography in accordance with aspects of the subject matter described herein.

FIGS. 1A to 6B illustrate various embodiments of LED devices and methods according to aspects herein. Referring to FIGS. 1A and 1B, a substrate, generally designated 10, for use in a LED device is illustrated. Substrate 10 can comprise any suitable material over which LED chips may be mounted and/or supported, for example, a ceramic based substrate. FIGS. 1A and 1B illustrate different methods associated with shaping surfaces, treating surfaces, and/or imparting a specific surface topography to portions of substrate 10 for use in LED devices. In some aspects, substrate 10 can comprise alumina ($Al_2O_3$), aluminum nitride (AlN), titanium dioxide ($TiO_2$), zirconia (e.g., zirconium dioxide, $ZrO_2$), combinations thereof, and/or any other ceramic or ceramic based material. Ceramic materials offer high isolation voltages and excellent heat dissipation capabilities. Substrate 10 can comprise impurities such as oxides, nitrides, and/or combinations thereof in amounts ranging from approximately 0.1% to approximately 10% of the overall substrate weight. For example, substrate 10 can include impurity substances such as silicon dioxide ($SiO_2$), magnesium oxide (MgO), calcium oxide (CaO), iron oxide ($Fe_2O_3$), potassium oxide ($K_2O$), sodium oxide ($Na_2O$), lithium oxide ($Li_2O$), and/or combinations thereof.

Substrate 10 can comprise any length and any width suitable for use in single-chip, multi-chip, or array-type LED devices and/or packages. In some aspects, substrate 10 comprises a large portion of material from which one or more individual package or device mounting substrates can be singulated. Substrate 10, and/or surfaces or portions thereof, can be shaped, profiled, or otherwise processed for improving reflection therefrom via reflection from one or more non-planar surfaces. As FIG. 1A illustrates, substrate 10 can be shaped via pressing, prior to sintering or firing. That is, in some aspects, substrate 10 comprises a powder based ceramic material that is shaped while in a green state (i.e., unfired state) via pressing. Upper and lower pressing molds $M_U$ and $M_L$, respectively, can shape powder based substrate 10 (e.g., and provide a surface topography to substrate 10) via pressing in directions indicated by the arrows.

In some aspects, shaping one or more surfaces of substrate 10 provides more light to be reflected therefrom, which can improve light extraction and brightness of LED devices utilizing substrate 10 and/or portions thereof. In some aspects, substrate 10 comprises a body of powder based ceramic material in a green state, which can be pressed by and/or between upper and lower molds $M_U$ and $M_L$, respectively, for providing substrate 10 with a shape corresponding to that of upper and lower molds $M_U$ and $M_L$, respectively. During pressing, substrate 10 can take on the shape of the mold, and retain the shape during firing or sintering.

Figure 1B:
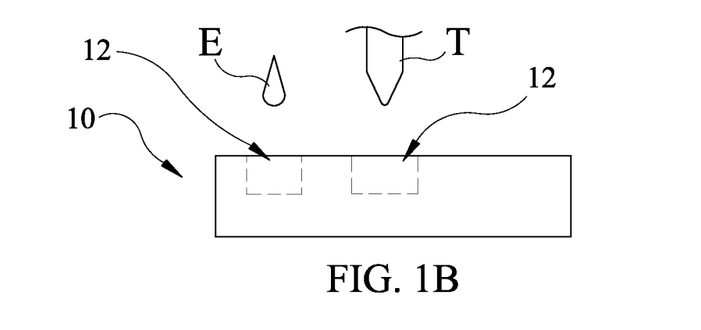

FIG. 1B illustrates another method of processing substrate 10 and/or selectively shaping substrate 10 for imparting a reflective surface topography thereto. In FIG. 1B, an etchant E or a tool T can be used to provide substrate 1B with non-planar surface topography after substrate 10 has been fired. Etchant E and/or tool T can be used to remove portions of substrate 10 and/or provide shaped portions within substrate 10, generally designated 12. In some aspects, tool T can be configured to machine surfaces of substrate 10 for providing the one or more shaped portions 12. Etchant E can comprise any suitable material configured to dry or wet-etch ceramic, for example, an acidic material.

FIGS. 2A to 2F illustrate exemplary aspects of LED devices, generally designated 20, which comprise shaped, profiled, and/or textured ceramic substrates 22. One or more LED chips 24 can be provided over portions of the non-planar substrates 22, as illustrated by FIGS. 2A to 2F. Substrates 22 can be shaped according to methods described hereinabove with respect to FIGS. 1A and 1B, or using any other suitable method.

LED chips 24 can comprise any size, shape, thickness, color, and/or structure (e.g., vertical or horizontal structure) of chip. LED chips 24 can comprise straight cut or beveled lateral side edges. In some aspects, LED chips 24 can directly attach to surfaces of ceramic based substrate 22 via silicone, epoxy, adhesive, or any other suitable material. In other aspects, one or more layers of material can be provided between LED chips 24 and substrate 22, for improving adhesion therebetween and/or for further improving reflection of substrate 22.

Figure 2A:
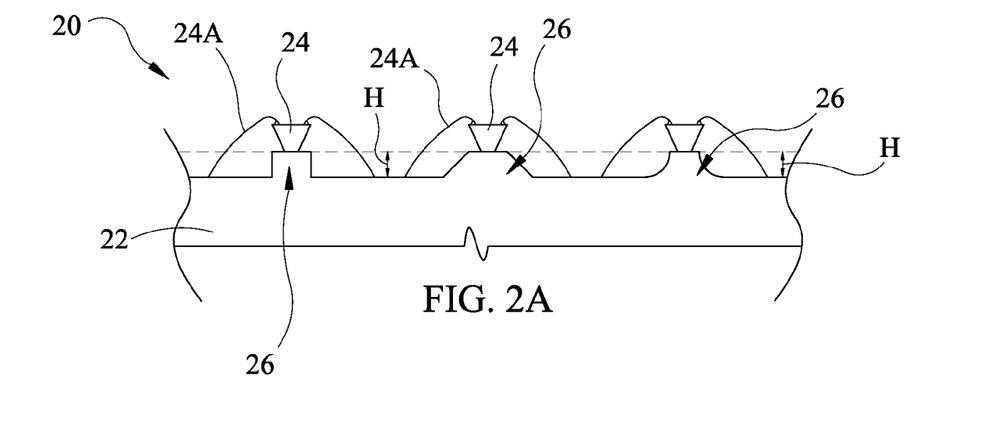
FIGS. 2A to 2F are schematic illustrations of LED devices having different surface topographies in accordance with aspects of the subject matter described herein.

As FIG. 2A illustrates, device 20 can comprise a substrate 22 having one or more surface features, for example, one or more raised non-planar portions, generally designated 26, provided thereon. Raised portions 26 can comprise pedestals over which LED chips 24 can be provided. Raised portions 26 can comprise substantially straight cut/machined edges, beveled edges, substantially curved edges, substantially angled edges, substantially concave edges, substantially convex edges, combinations thereof, and/or any other shape, angle, or profile.

Raised portions 26 can comprise any size, shape, profile shape, topography, and/or thickness. In some aspects, a height H of raised portions 26 can comprise any value ranging from approximately 50 μm to approximately 500 micrometers (μm). For example, height H of raised portion 26 can comprise a value between approximately 50 μm to 100 μm, approximately 100 to 200 μm, approximately 200 to 300 μm, approximately 300 to 400 μm, approximately 400 to 500 μm, or greater than approximately 500 μm. Height H (e.g., or thickness) of each portion 26 can be the same, or pedestals of different heights H can be provided. In some aspects, a portion of each pedestal (e.g., 26) can be substantially flat or planar for mounting at least one LED chip 24 thereon.

Height H of each portion 26 can be approximately a quarter (i.e., ¼ or 0.25) of substrate 22 thickness, approximately a third (i.e., ⅓ or 0.33) of substrate 22 thickness, or approximately half (i.e., ½ or 0.5) of substrate 22 thickness, or more. Substrate 22 can comprise any thickness, for example, ranging from approximately 100 μm to 2 mm. Height H of portions 26 can vary, for example, upon physical properties (e.g., brittleness, moldability, etching properties, etc.) of ceramic substrate 22. In some aspects, LED chips 24 can be mounted or die attached over raised portions 24, but electrically connected (e.g., wirebonded) to non-raised (e.g., flat) portions of substrate 22 disposed about each raised portion 26. LED chips 24 can be die attached directly to raised portion 26 or to one or more intervening layers of metal or dopant sheets deposited over ceramic substrate 22 as described herein. LED chips 24 can be die attached via adhesive, epoxy, solder, silicone, and/or eutectic die attach.

Figure 2B:
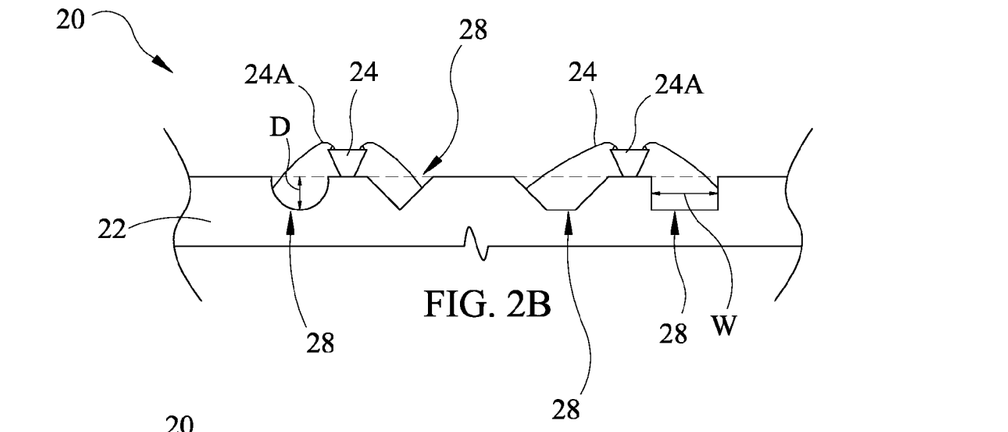

FIG. 2B illustrates another example of a device 20 comprising a shaped substrate 22 having a textured or non-planar surface. As FIG. 2B illustrates, one or more surface features such as depressed portions, generally designated 28, can be provided in, over, and/or on substrate 22. Depressed portions 28 can comprise one or more grooves, channels, holes, or trenches provided about LED chips 24. Depressed portions 28 can be provided between adjacent LED chips 24, and can partially or completely surround respective LED chips 24. Depressed portions 28 can comprise any suitable depth, and any suitable width. Depressed portions 28 can comprise uniform depths and/or widths or variable depths and/or widths. In some aspects, LED chips 24 can physically and/or electrically connect to portions of substrate 22 via electrical connectors 24A, such as wirebonds.

In some aspects, depressed portions 28 comprise any suitable width W ranging from approximately 1 μm to approximately 1 mm. Depressed portions 28 can comprise any suitable depth D, for example, up to approximately one-half (i.e., ½ or 0.5) of a thickness of the ceramic substrate 22. Depressed portions 28 can be fabricated via chemical processes (e.g., etching) or mechanical processes (e.g., pressing, polishing, cutting, scribing, and/or machining) as described herein. Trenches or depressed portions 28 can comprise a profile shape that is substantially rounded, squared, triangular, trapezoidal, regular, irregular, and/or asymmetrical when viewed from the side and/or above. The shaping of substrate 22 can be accomplished via molding (e.g., prior to firing) of ceramic substrate 22 or via etching or machining after firing substrate 22 as described hereinabove.

Figure 2C:
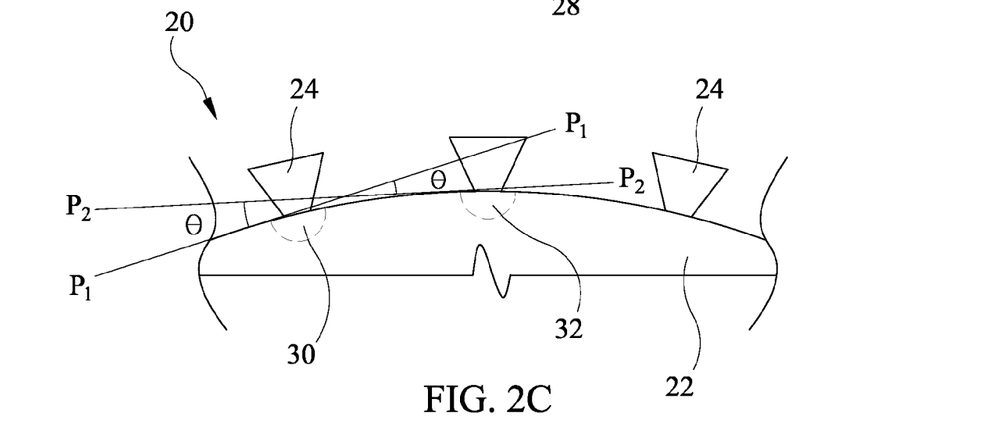
Figure 2D:
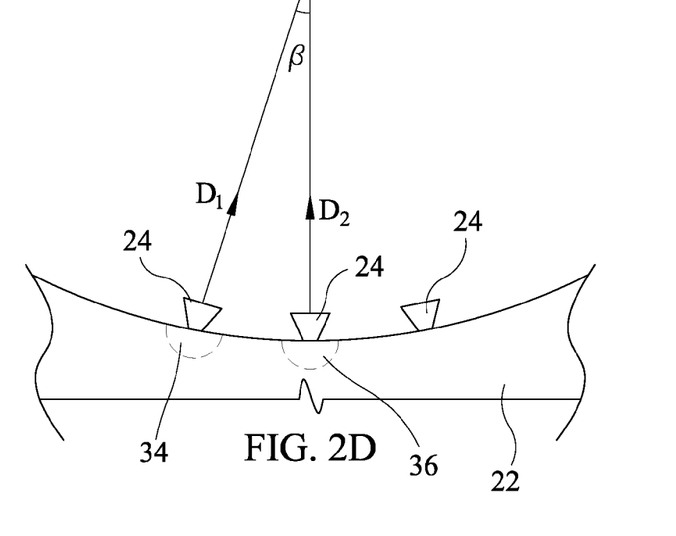

Referring to FIGS. 2C and 2D, a light emitter device or LED device 20 is illustrated. LED device 20 can comprise a textured and/or non-planar substrate 22. In some aspects as illustrated by FIG. 2C, substrate 22 can comprise a substantially semi-circular (e.g., concave or convex) cross-sectional shape. In some aspects as illustrated by FIG. 2D, substrate 22 can comprise a substantially convex cross-sectional shape. LED chips 24 can be supported by the non-planar substrate 22 such that beam patterns of any size, shape, and/or output can be achieved. In some aspects, LED device 20 comprises a portion of an LED package or component.

FIG. 2C is a schematic illustration of LED device 20 comprising non-coplanar first and second portions or regions 30, 32 of curved substrate 22. A first LED chip 24 can be supported by the first substrate portion or region 30, and a second LED chip 24 can be supported by the second substrate portion or region 32. The first and second substrate portions or regions 30, 32 can be arranged along (or parallel to) planes $P_1$, $P_2$ oriented apart from one another by a nonzero angle θ. In some aspects, angle θ is sufficiently small that emissions of first and second LED chips 24 overlap in order to reduce perceptible flicker, perceptible variation (with respect to area) in luminous flux, reduce perceptible variation in aggregated output color, and/or improved thermal management by reducing hot spots within device 20. In certain embodiments, θ is less than or equal to approximately 45°, 35°, 30°, 25°, 20°, 15°, 10°, 7.5°, 5°, or 2.5°.

FIG. 2D is a schematic illustration of LED device 20. Device 20 comprises non-planar first and second portions or regions of substrate 22, generally designated 34 and 36, respectively. LED chips 24 supported by the first and second substrate portions or regions 34 and 36 are configured to emit light in different directions. For example, first and second directions of centers of beams are denoted D1 and D2. A first LED chip 24 is configured to emit light in first direction D1, and a second, optionally adjacent LED chip 24 is configured to emit light in second direction D2. LED chips 24 are separated by a nonzero angle β. In some aspects, the angle β is sufficiently small that emissions of first and second LED chips 24 substantially overlap in order to reduce perceptible variations in color and/or luminous flux while improving thermal management by reducing hot spots within device 20. In certain embodiments, β is less than or equal to approximately 45°, 35°, 30°, 25°, 20°, 15°, 10°, 7.5°, 5°, or 2.5°.

Figure 2E:
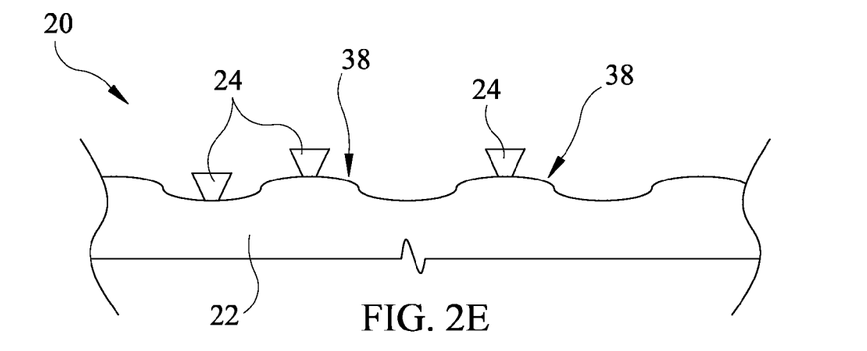

FIG. 2E illustrates device 20 comprising a non-planar surface topography having multiple waves or stepped regions, generally designated 38. Stepped regions 38 can comprise parallel or non-parallel areas of alternating convex and concave surface topographies. Stepped regions 38 can comprise parallel waves, concentric round waves, a grid of waves, and/or combinations thereof. In some aspects, LED chips 24 can be place only over raised portions of stepped regions 38, only over depressed portions of stepped regions 38, or in both raised and depressed portions of stepped regions 38. An array of LED chips 24 can be provided over each substrate 22 and arranged to form any size, shape, and/or pattern of chips. Different colors of LED chips 24 can be used in each device 20. LED chips 24 can also be provided below one or more phosphors, where desired.

In some aspects, surface shaping and/or texturing as described herein provide planar (e.g., flat) regions or areas of substrate 22 for ensuring adequate die placement and attachment. Where substrate 22 comprises curved surfaces, portions thereof are smooth enough to allow for adequate die attach and adequate heat transfer between LED chip 24 and substrate 22.

Figure 2F:
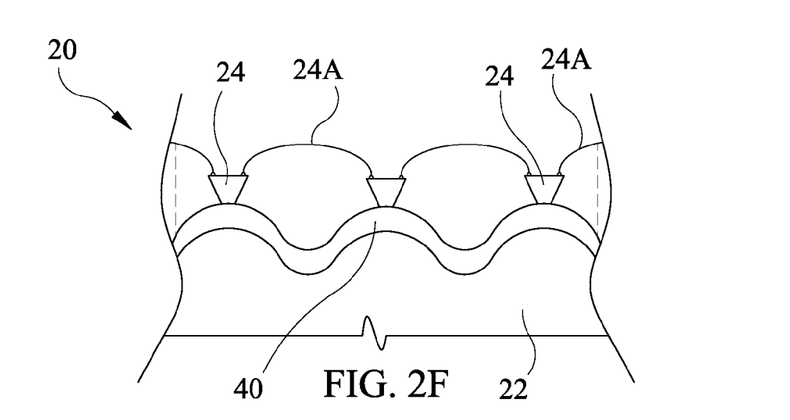

FIG. 2F illustrates a substrate 22 having a surface topography that is stepped, curved, and/or wavy. LED chips 24 can be placed proximate the apex (e.g., maximum height) of each step, curve, or wave. As FIG. 2F further illustrates, one or more layers of intervening material 40 can be provided between substrate 22 and at least one LED chip 24 for improving adhesion and/or thermal dissipation therebetween. Material 40 can comprise a metal, a metal alloy, an ENEPIG (i.e., or Electroless Nickel, Electroless Palladium, Immersion Gold) finish, an ENIG (i.e., Electroless Nickel Immersion Gold) finish, Ti, Pt, Ag, Sn, Au, Pd, and/or combinations thereof. LED chips 24 can be serially connected via wirebonds 24A, or electrically connected in parallel. An array of any pattern, size, shape, physical arrangement, and/or electrical arrangement of LED chips 24 is contemplated.

Figure 3:
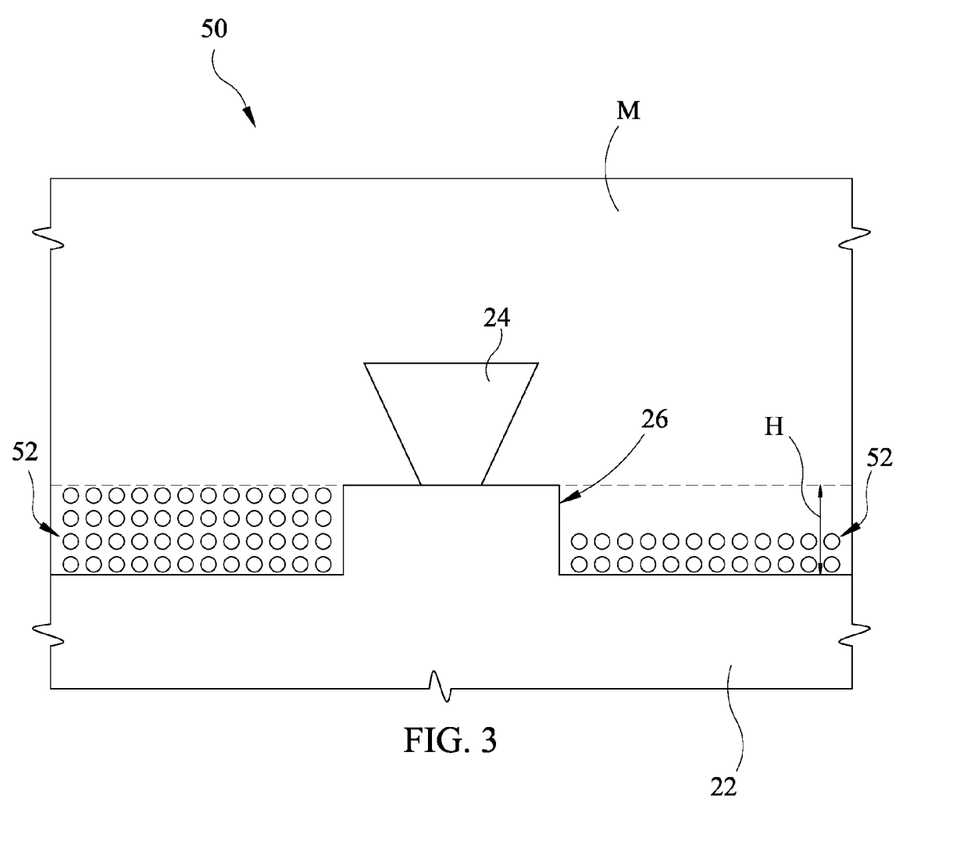
FIG. 3 is a schematic illustration of an LED device in accordance with aspects of the subject matter described herein.

FIG. 3 illustrates an LED device or package, generally designated 50. LED device 50 can comprise a substrate 22, at least one LED chip 24, and a filling material 52. Filling material 52 can be provided on or over substrate 22, and can at least partially fill one or more voids within substrate 22, for example, one or more voids formed about raised portions 26 or raised areas of substrate 22 as shown and described in FIG. 2A. Filling material 52 can be filed to any level over substrate 22. Different portions of substrate 22 can be filled with different thicknesses of filling material 52 where desired. In some aspects, a thickness of filling material 52 is substantially the same height H as raised portion 26. In other aspects, a thickness or height of filling material 52 is less than or greater than height H of raised portion 26.

Filling material 52 can be applied on or over substrate 22 prior to attaching LED chip 24, or after attaching LED chip 24. Filling material can also be applied prior to encapsulation within a bulk encapsulant material M and/or provision of LED chip 24 below a lens. That is, filling material 52 can comprise a same or a different material as the bulk encapsulant M of the device. Filling material 52 and encapsulant material M can each optionally include one or more dopants. In some aspects, filling material 52 and encapsulant material M each comprise a silicone epoxy or encapsulant. Various members and/or features of (e.g., LED chips, wirebonds, substrate, etc.) of LED device 50 can be fully or partially encapsulated with one or more filling materials 52 and/or encapsulant material M. Filing material 52 can comprise a same refractive index as bulk encapsulant material M, or a different refractive index. Similarly, filling material 52 can comprise a material having different mechanical properties as compared to encapsulant material M. Any desirable refractive indexes and/or mechanical properties can be obtained by mixing different filling materials (e.g., 52 and E) together.

In some aspects, filling material 52 and encapsulant material M can each comprise one or more optional dopants or dopant materials. Dopants may comprise, for example, $TiO_2$ particles, $Al_2O_3$ particles, AlN particles, $ZrO_2$ particles, phosphor particles, oxide particles, nitride particles, and/or combinations thereof. Where used, dopant particles can range in size (e.g., diameter) from approximately 5 nanometers (nm) to approximately 50 μm. Where used, dopant loading can comprise approximately 50% or less of the overall volume of filling material 52, encapsulant material M, or the combined volume of filling material 52 and encapsulant material M. Where used, dopants can be applied via evaporation of a solvent which can leave behind particles upon evaporation.

Where used, dopant materials can include one or more impurity substances, for example, up to approximately 10% of the dopant volume or weight. Impurity substances can comprise an oxide, a nitride, and/or combinations thereof. For example, impurity substances can comprise oxides, nitrides, $SiO_2$, MgO, CaO, $Fe_2O_3$, $K_2O$, $Na_2O$, $Li_2O$, and/or any combination thereof.

FIGS. 4A to 4D depict exemplary LED devices, generally designated 60, having non-planar surfaces and/or various surface topographies over which LED chips 24 can be provided. LED devices 60 can comprise a ceramic or ceramic based substrate 22 having a shaped or texturized surfaces and/or treated surfaces over which LED chips 24 are provided.

In some aspects, a first surface of substrate 22 can be treated and/or provided with a coating or sheet of material 62 for improving optical properties and/or reflection therefrom. Material 62 can comprise a phosphor and/or ceramic particle dopant sheet applied directly over the surface of ceramic substrate 22. In some aspects, material 62 is applied prior to die attaching LED chips 24, such that material 62 is provided between LED chip 24 and ceramic substrate 22.

Material 62 can comprise a non-metallic sheet. Material 62 can comprise a sheet of particle dense material including, for example, phosphor particles, lumiphoric particles, and/or dopant materials (e.g., oxides, nitrides, $TiO_2$ particles, $Al_2O_3$ particles, AlN particles, $ZrO_2$ particles), with or without one or more impurities (e.g., oxides, nitrides, $SiO_2$, MgO, CaO, $Fe_2O_3$, $K_2O$, $Na_2O$, $Li_2O$, and/or any combination thereof). Where present, impurities can comprise approximately 10% or less of the overall weight and/or volume of dopants within dopant sheet. Material 62 can also include one or more binding materials, such as silicone, epoxy, flux material, organic solvent, and/or combinations thereof.

Figure 4A:
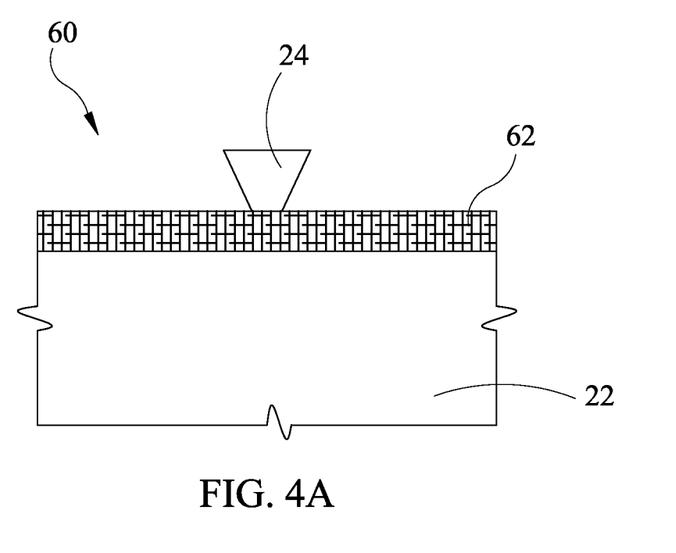

As FIG. 4A illustrates and in some aspects, material 62 can comprise a substantially planar layer of material disposed over a substantially planar surface of substrate 22. Material 62 can comprise a substantially uniform thickness over substrate 22. Material 62 can comprise phosphor or dopant particles and a binder. Sheet of material 62 can be pre-formed (e.g., pre-dried/pre-cured) prior to application over substrate 22. In other aspects, sheet of material 62 can be cured and/or dried directly to substrate 22. More than one sheet of material 62 can be applied over substrate 22 and allowed to cure thereon.

Figure 4B:
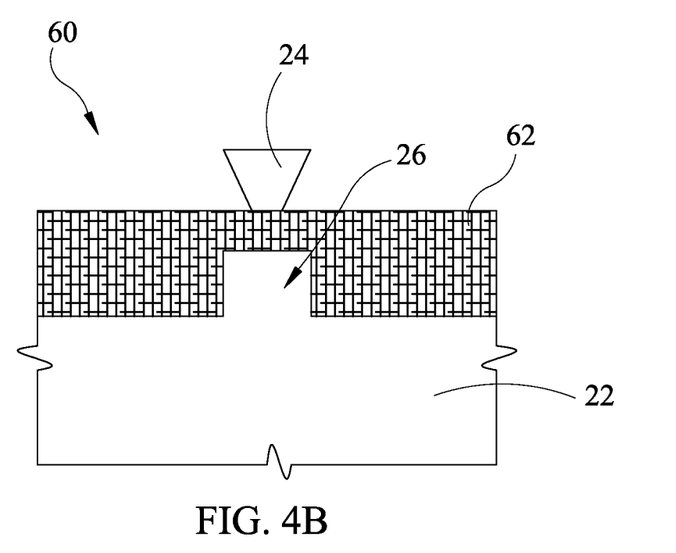
Figure 4C:
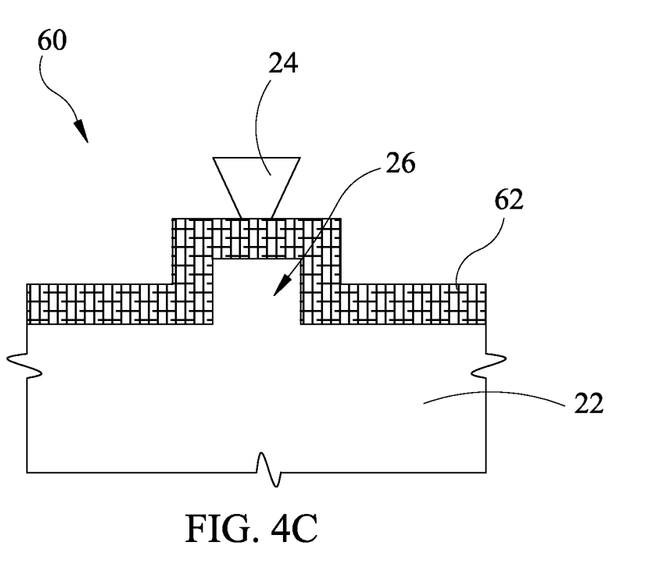

As FIGS. 4B and 4C illustrate, material 62 can also be disposed over non-planar surfaces of substrate 22. That is, material 62 can be applied on/over raised portions 26 of substrate 22 as well as non-raised portions. As FIG. 4B illustrates, material 62 can form a substantially planar surface over which LED chips 24 can mount. In other aspects, as shown in FIG. 4C, material 62 can comprise a substantially non-planar surface corresponding to the texturized surface topography of substrate 22. That is, material 62 can comprise a substantially uniform layer which corresponds to the surface topography of substrate 22. In contrast and as FIG. 4B illustrates, material 62 can completely cover non-raised portions 26 for forming a substantially planar surface over a non-planar substrate. Material 62 can comprise a substantially uniform thickness (e.g., FIG. 4A) or a non-uniform thickness (e.g., FIG. 4B).

As illustrated by FIG. 4B, sheet of material 62 can encapsulate the entire surface of substrate 22 and raised portions 26 (e.g., pedestals). According to another aspect, as shown in FIG. 4C, sheet of material 62 can assume the shape, profile, or topography of underlying substrate 22, including pedestal or raised portion 26. LED chips 24 can be mounted onto and/or over material 62, which can also be shaped as a pedestal corresponding to substrate 22 and raised portions 26. Material 62 can conform and/or cover any surface topography as descried herein, for example, as shown in FIGS. 2A to 2F.

Figure 4D:
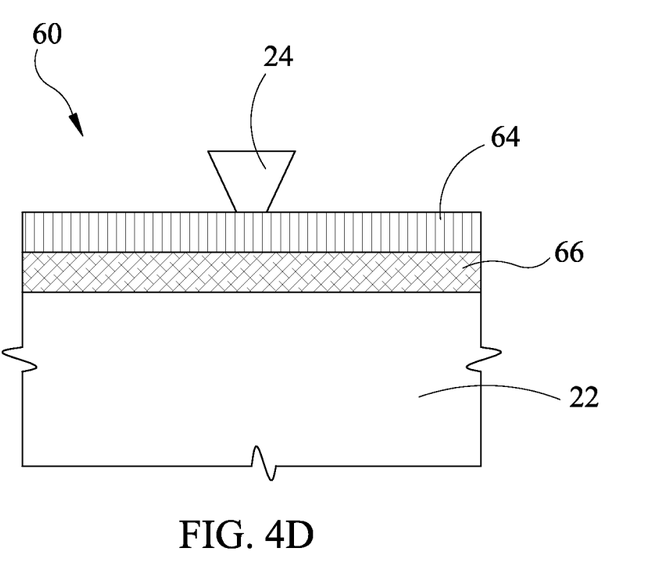

FIG. 4D illustrates a plurality of sheets of the same and/or different materials 64 and 66 disposed over substrate 22. Each sheet of material 64 and 66 can comprise a binder and one or more particles or dopants, with or without impurities. Each sheet 64 and 66 can comprise one type or particle, or multiple different types of particles. Each sheet 64 and 66 can comprise a substantially uniform thickness, a substantially non-uniform thickness, substantially the same thickness, and/or different thicknesses. A plurality of sheets can be applied over a planar substrate 22 or a non-planar substrate. The plurality of sheets of material 64 and 66 can be pre-formed (e.g., pre-cured, dried) prior to application over substrate 22 or applied and later cured over substrate 22. Sheets of material 62, 64, and 66 as described herein can be molded, polished, or otherwise treated before/after application to substrate 22, thereby resulting in a variety of different surface topographies. Sheets 62, 64, and/or 66 as described herein can improve reflection of light from substrate 22 and devices 60. In other aspects, sheets 62, 64, and/or 66 as described herein improve thermal dissipation between LED chips 24 and substrate 22, thereby resulting in more efficient and brighter devices 60.

In some aspects, LED devices described herein can comprise one or more phosphoric and/or ceramic particles or dopants incorporated into the body of the ceramic based substrate. For example, FIGS. 5A to 5F illustrate LED embodiments of an LED device, generally designated 70. Device 70 can comprise a ceramic or ceramic based substrate 72 and one more LED chips 24 provided thereon. In some aspects, substrate 72 comprises one or more phosphoric, ceramic, and/or dopant particles 74, which differ from the material contained in the bulk of the ceramic substrate 72.

Particles 74 can comprise $Al_2O_3$ particles, AlN particles, $TiO_2$ particles, $ZrO_2$ particles, phosphor particles, oxide particles, nitride particles, and/or any combination thereof. Particles 74 can also comprise up to 10% by weight of impurities, as previously described herein. In some aspects, particles 74 comprise dopants incorporated into the bulk of the ceramic substrate 72. Particles 74 or dopants can be incorporated into substrate 72 either in a green state or in a fired state. For example, particles 74 or dopants can be mixed in with the bulk of the ceramic particles forming substrate 72, and concentrated within one or more portions thereof. The particles 74 can adhere to the bulk particles of ceramic substrate 72 during pressing and/or sintering.

Figure 5A:
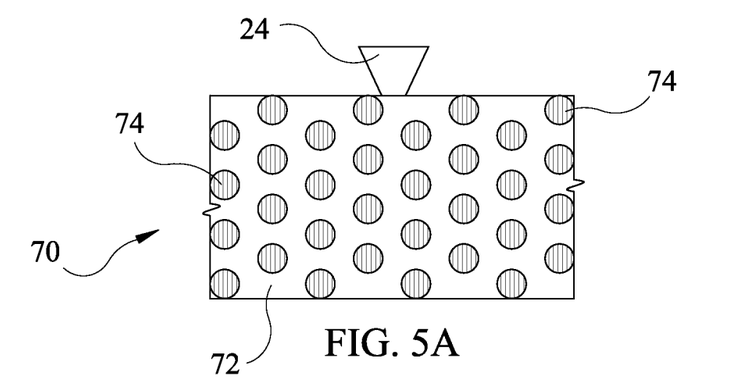

In some aspects as illustrated in FIGS. 5A to 5F, the concentration and/or distribution of particles 74 can be varied by design, material properties, and/or based upon desired beam patterns, beam shape, desired color(s) of light to be emitted by device, etc. As shown in FIG. 5A and in some aspects, particles 74 can be uniformly dispersed within substrate 72. Particles 74 can be uniformly dispersed and/or concentrated below one or more LED chips 74

Figure 5B:
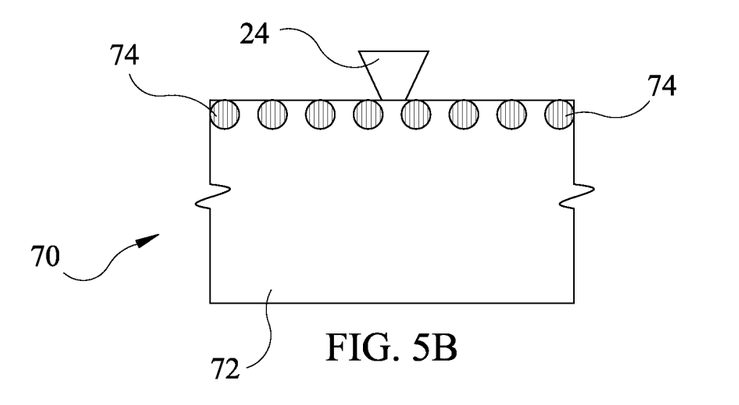
Figure 5C:
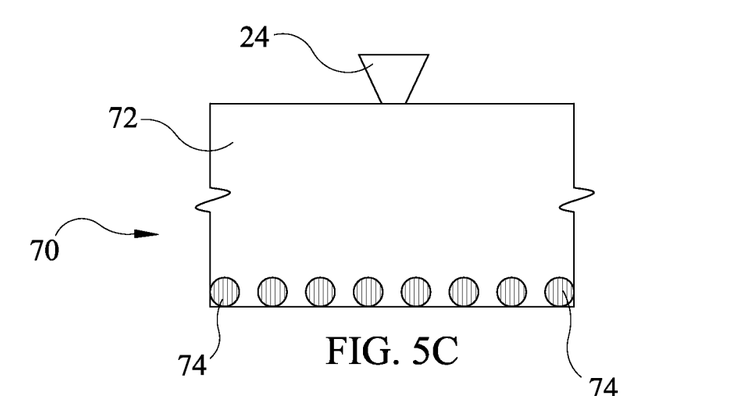

As FIGS. 5B and 5C illustrate, particles 74 can also be provided within a pre-determined pattern, distribution, and/or concentration within substrate 72. As shown in FIG. 5B, particles 74 can be provided proximate the top surface of substrate 72, and concentrated directly below LED chips 24. Some portions of substrate 72 can remain devoid of particles 74. As FIG. 5C illustrates, particles 74 can be provided proximate a bottom surface of substrate 72. As FIG. 5C illustrates, portions of substrate 72 that are directly below LED chips 24 can be devoid of particles 74.

Figure 5D:
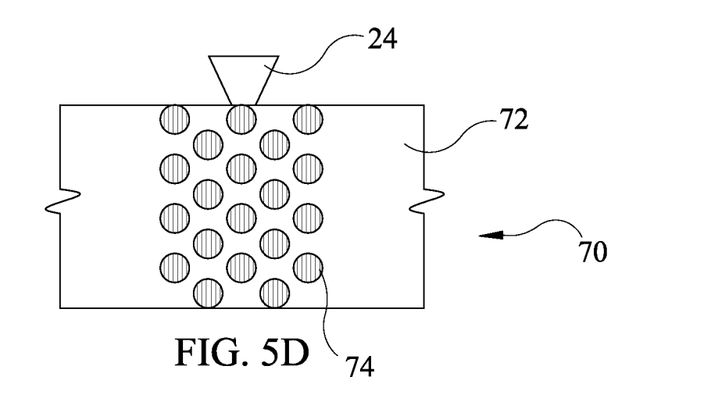

Particles 74 can be provided in a single row, a single column, or a plurality of columns and rows within substrate 72. Particles 74 can be uniformly or non-uniformly dispersed within substrate 72. Particles 74 can be arranged in random or non-random dispersions. As FIG. 5D illustrates, particles 74 can be concentrated to one or more vertical portions of substrate 72, for example, directly below LED chip 24 for improving thermal dissipation of device 70. Particles 74 can be aligned with respect to each other in one or more rows and/or columns. In some aspects, particles 74 can be limited to areas or portions of substrate 72 that are directly below one or more LED chips 24.

Figure 5E:
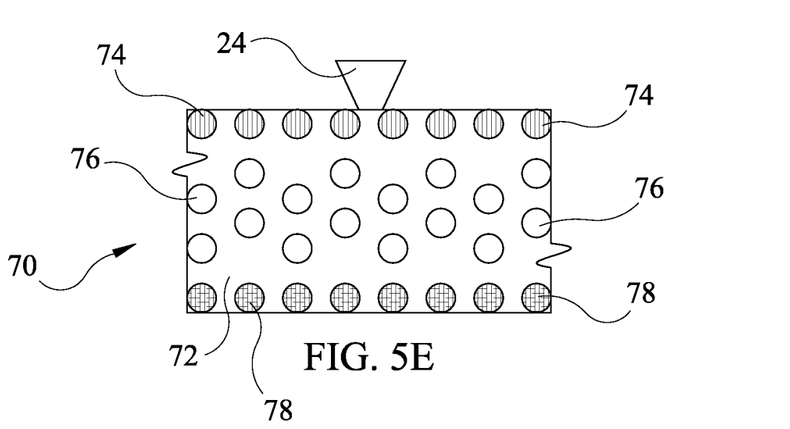
Figure 5F:
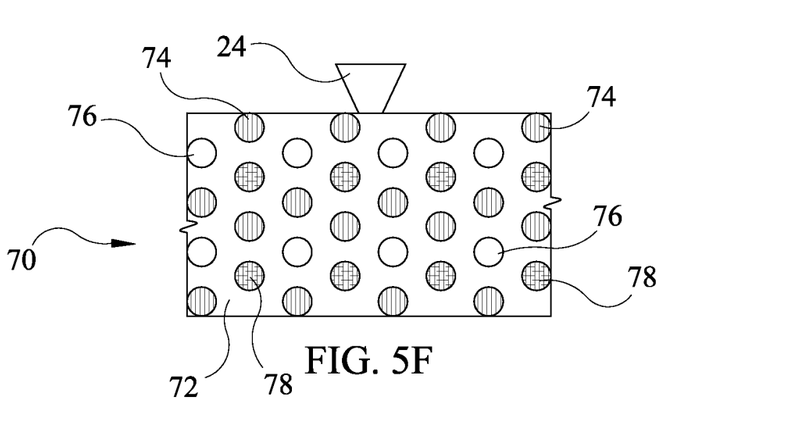

More than one type of particle can be incorporated into substrate 72. As FIGS. 5E and 5F illustrate, a plurality of different particles 74, 76, and 78 can be provided in substrate 72. In some aspects, each particle can be provided within specific portions of substrate 72. That is, one type of particle 74 can be disposed proximate an upper surface of substrate 72, in areas directly below LED chip 24. Another, second type of particle 76 can be disposed proximate a middle (e.g., intermediate portion) of substrate 72 between first type of particles 74 and a third type of particles 78. The third type of particles 78 can be provided proximate a bottom portion and/or bottom surface of substrate 72, and disposed furthest from LED chip 24. Different particles 74, 76, and 78 can be arranged in substantially non-uniform or uniform arrangements. As FIG. 5F illustrates, substrate 72 can comprise a uniform dispersion of different types of particles, where the particles are randomly mixed, or interspersed.

In some aspects, device 70 can comprise a single type of particle 74. In other aspects, device 70 can comprise multiple types of particles. Where multiple types of particles are used, the particles 74, 76, and 78 can be provided in a uniform dispersion, interspersed in a random mixture, and/or provided in non-uniform, predetermined patterns within substrate 72. In some aspects, particles can be concentrated within specific portions of substrate 72.

Figure 6A:
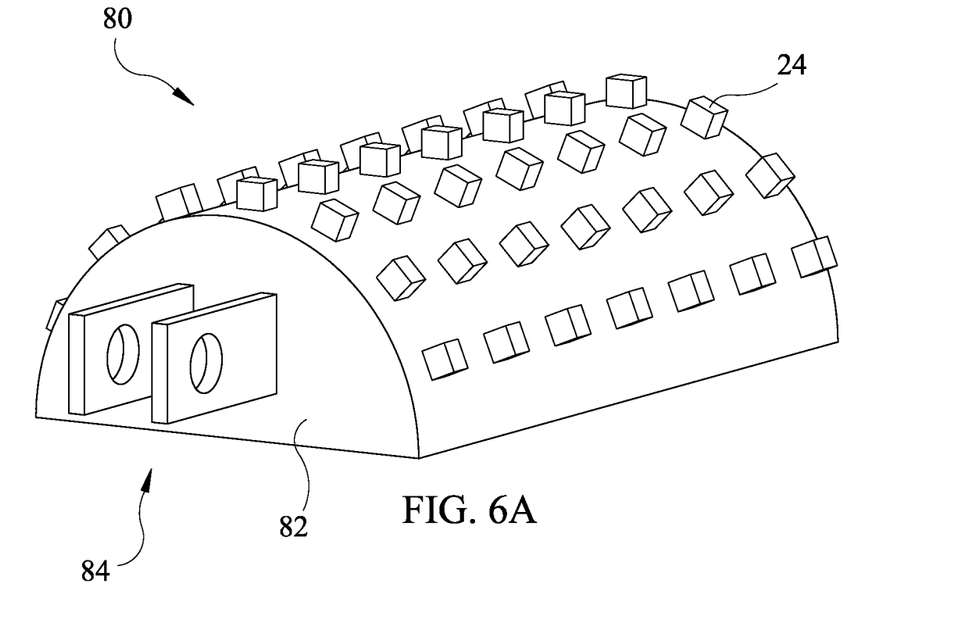
FIGS. 6A and 6B are schematic illustrations of LED devices utilizing surface treatments and/or topography in accordance with aspects of the subject matter described herein.
Figure 6B:
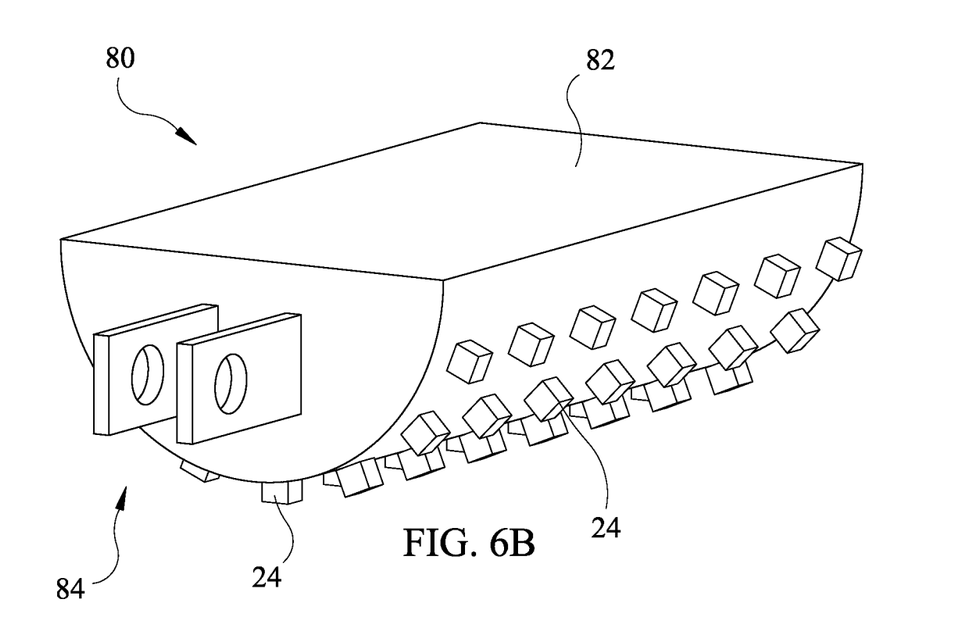

FIGS. 6A to 6B illustrate an LED device, generally designated 80. Device 80 can comprise an elongated ceramic substrate 82 over which a plurality of LED chips 24 can be provided and/or supported. Device 84 can comprise one or more electrically conductive portions 84, such as one or more pins and/or a plug, for directly electrically connecting to an AC or DC power source. As FIGS. 6A and 6B illustrate, substrate 82 can comprise a substantially convex or concave surface. Surfaces of substrate 82 can be provided via molding, machining, etching, or any other suitable method. As described herein, substrate 82 can comprise a powdered ceramic having a non-planar surface. One or more dopants and/or impurities can optionally be provided therein (e.g., pressed or molded therein). Dopants and/or impurities can improve thermal properties and/or optics of device 80

The concave and convex surfaces of device 80 can be smooth for providing suitable areas over which LED chips 24 may attach. LED chips 24 may emit light in different directions which may or may not intersection for providing desired beam patterns. The surface topography associated with device 80 is substantially curved for providing desired light emission.

A method of providing an LED device can comprise providing a substrate having a texturized, non-planar, and/or doped surface. One or more LED chips can be mounted to the texturized, non-planar, and/or doped surface of substrate. Ceramic materials advantageously improve heat dissipation within LED devices, and can also inexpensively improve optics of devices, such as light emission and brightness. Shaping of the substrate or substrate can be accomplished, for example, by molding prior to firing or by mechanical/chemical process after the firing. Mechanical shaping can comprise processes such as, for example, machining, milling, punching, cutting, scraping, broaching, stamping, and/or drilling the portion of the substrate and/or combinations thereof. Chemical shaping can comprise removing portions of the substrate via chemical etching.

Aspects as disclosed herein can provide one or more of the following beneficial technical effects: reduced cost of solid state lighting apparatuses; reduced perceptibility of color or light variation of LED chips; reduced perceptibility of variation in intensity (e.g., with respect to area and/or direction) of light output by LED chips; improved dissipation of heat (and concomitant improvement of operating life) within LED devices; improved manufacturability of LED devices; and/or improved light extraction.

While the subject matter has been has been described herein in reference to specific aspects, features, and illustrative embodiments, it will be appreciated that the utility of the subject matter is not thus limited, but rather extends to and encompasses numerous other variations, modifications and alternative embodiments, as will suggest themselves to those of ordinary skill in the field of the present subject matter, based on the disclosure herein.

Various combinations and sub-combinations of the structures and features described herein are contemplated and will be apparent to a skilled person having knowledge of this disclosure. Any of the various features and elements as disclosed herein can be combined with one or more other disclosed features and elements unless indicated to the contrary herein. Correspondingly, the subject matter as hereinafter claimed is intended to be broadly construed and interpreted, as including all such variations, modifications and alternative embodiments, within its scope and including equivalents of the claims.

What is claimed is:

1. A light emitter device, comprising:
   a ceramic based substrate comprising a planar surface having a plurality of non-planar surface features disposed therein, the plurality of surface features having variable heights or depths; and
   at least one light emitter chip disposed on the substrate; and
   a filling material;
   wherein the filling material is disposed over and/or within a portion of the one or more surface features.

2. The light emitter device according to claim 1, wherein the filling material comprises a silicone or epoxy encapsulant material.

3. The light emitter device according to claim 1, wherein the filling material can comprise at least a first material and a second material, wherein the first and second materials can comprise different refractive indexes and/or different mechanical properties.

4. The light emitter device according to claim 1, wherein the filling material comprises at least one dopant.

5. The light emitter device according to claim 4, wherein the at least one dopant comprises a particle size ranging from approximately 5 nanometers (nm) to approximately 50 micrometers (μm).

6. The light emitter device according to claim 4, wherein the at least one dopant comprises an oxide or a nitride material.

7. The light emitter device according to claim 4, wherein the at least one dopant comprises a particle selected from the group consisting of alumina ($Al_2O_3$), aluminum nitride (AlN), titanium dioxide ($TiO_2$), zirconia or zirconium dioxide ($ZrO_2$), phosphor, and/or combinations thereof.

8. The light emitter device according to claim 1, wherein the plurality of surface features form a texturized surface of the substrate.

9. The light emitter device according to claim 1, wherein the plurality of surface features comprises a plurality of trenches, holes, indentions, depressions, waves, or pedestals.

10. The light emitter device according to claim 1, wherein the plurality of surface features comprises a plurality of curved surfaces.

11. The light emitter device according to claim 1, wherein the ceramic based substrate comprises alumina ($Al_2O_3$), aluminum nitride (AlN), titanium dioxide ($TiO_2$), or zirconia or zirconium dioxide ($ZrO_2$).

12. The light emitter device according to claim 11, wherein the substrate comprises one or more impurity substances comprising silicon dioxide ($SiO_2$), magnesium oxide (MgO), calcium oxide (CaO), iron oxide ($Fe_2O_3$), potassium oxide ($K_2O$), sodium oxide ($Na_2O$), lithium oxide ($Li_2O$), or combinations thereof.

13. The light emitter device according to claim 1, further comprising a dopant sheet disposed over a portion of the ceramic based substrate.

14. The light emitter device according to claim 1, wherein the ceramic based substrate is doped with one or more dopant particles.

15. A light emitter device, comprising:
   a ceramic based substrate comprising a ceramic upper surface, wherein a portion of the ceramic upper surface is a non-uniform texturized surface for reflecting light; and
   at least two adjacent light emitting diode (LED) chips disposed on the substrate, wherein each LED chip is provided at least partially over the texturized surface, and wherein the texturized surface extends between the at least two adjacent LED chips for reflecting light therefrom.

16. The light emitter device according to claim 15, wherein the at least two LED chips are directly attached to portions of the texturized surface via silicone, epoxy, or adhesive.

17. The light emitter device according to claim 15, wherein one or more metallic layers are disposed between the ceramic based substrate and the at least two LED chips.

18. The light emitter device according to claim 15, wherein the texturized surface comprises a plurality of raised pedestals, trenches, concave surfaces, convex surfaces, stepped surfaces, or waves consisting of alternating convex and concave portions.

19. The light emitter device according to claim 15, wherein the texturized surface comprises a plurality of pedestals, each having a height ranging from approximately 50 to 100 μm, 100 to 200 μm, 200 to 300 μm, 300 to 400 μm, 400 to 500 μm, or more than approximately 500 μm.

20. The light emitter device according to claim 15, wherein the ceramic based substrate comprises alumina ($Al_2O_3$), aluminum nitride (AlN), titanium dioxide ($TiO_2$), or zirconium dioxide ($ZrO_2$).

21. The light emitter device according to claim 20, wherein the ceramic based substrate comprises between approximately 0.1 and 10 weight % of one or more impurity substances.

22. The light emitter device according to claim 21, wherein the one or more impurity substances comprises an oxide, a nitride, and/or combinations thereof.

23. The light emitter device according to claim 22, wherein the one or more impurity substances comprises silicon dioxide ($SiO_2$), magnesium oxide (MgO), calcium oxide (CaO), iron oxide ($Fe_2O_3$), potassium oxide ($K_2O$), sodium oxide ($Na_2O$), lithium oxide ($Li_2O$), and/or combinations thereof.

* * * * *